(12) United States Patent
Albano et al.

(10) Patent No.: US 8,192,789 B2
(45) Date of Patent: Jun. 5, 2012

(54) METHOD FOR MANUFACTURE AND STRUCTURE OF MULTIPLE ELECTROCHEMISTRIES AND ENERGY GATHERING COMPONENTS WITHIN A UNIFIED STRUCTURE

(75) Inventors: Fabio Albano, Ann Arbor, MI (US); Chia Wei Wang, Ypsilanti, MI (US); Ann Marie Sastry, Ann Arbor, MI (US)

(73) Assignee: Sakti3, Inc., Ann Arbor, MI (US)

( * ) Notice: Subject to any disclaimer, the term of this patent is extended or adjusted under 35 U.S.C. 154(b) by 0 days.

(21) Appl. No.: 12/614,169

(22) Filed: Nov. 6, 2009

(65) Prior Publication Data
US 2010/0136245 A1  Jun. 3, 2010

Related U.S. Application Data

(60) Provisional application No. 61/112,707, filed on Nov. 7, 2008.

(51) Int. Cl.
*B05D 5/12* (2006.01)
*C23C 14/00* (2006.01)
*H01M 6/00* (2006.01)

(52) U.S. Cl. .......... 427/115; 427/466; 204/192.15; 204/192.18; 29/623.1; 29/623.5

(58) Field of Classification Search .......... 427/466, 427/115; 204/198.15, 192.18, 192.15; 29/623.1, 29/623.5
See application file for complete search history.

(56) References Cited

U.S. PATENT DOCUMENTS

| | | | |
|---|---|---|---|
| 6,083,637 A | 7/2000 | Walz et al. | |
| 6,650,000 B2 * | 11/2003 | Ballantine et al. | 257/551 |
| 6,664,786 B2 | 12/2003 | Kretschmann et al. | |
| 7,150,931 B1 | 12/2006 | Jaffrey | |
| 2003/0044662 A1 | 3/2003 | Walsh | |
| 2005/0073314 A1 | 4/2005 | Bertness et al. | |
| 2005/0258801 A9 | 11/2005 | Johnson et al. | |
| 2006/0038536 A1 * | 2/2006 | LaFollette et al. | 320/112 |
| 2006/0055175 A1 | 3/2006 | Grinblat | |
| 2007/0190418 A1 | 8/2007 | Chiang et al. | |
| 2010/0196744 A1 * | 8/2010 | Tucholski et al. | 429/7 |

OTHER PUBLICATIONS

International Search Report & Written Opinion of PCT Application No. PCT/US2009/063571, date of mailing Dec. 29, 2009, 12 pages total.

* cited by examiner

*Primary Examiner* — Brian K Talbot
(74) *Attorney, Agent, or Firm* — Richard T. Ogawa; Ogawa P.C.

(57) ABSTRACT

The present invention provides a method to design, manufacture and structure a multi-component energy device having a unified structure, wherein the individual components are chosen from the list consisting of electrochemical cells, photovoltaic cells, fuel-cells, capacitors, ultracapacitors, thermoelectric, piezoelectric, microelectromechanical turbines and energy scavengers. Said components are organized into a structure to achieve an energy density, power density, voltage range, current range and lifetime range that the single components could not achieve individually, i.e. to say the individual components complement each other. The individual components form a hybrid structure, wherein the elements are in electrical, chemical and thermal conduction with each other. The electrochemical cells present multiple chemistries to accommodate a wider range of voltage and current compared to individual ones; energy-scavenging elements are utilized to collect energy and replenish it to other components within the unified structure.

20 Claims, 4 Drawing Sheets

METHOD FOR MANUFACTURE AND STRUCTURE OF MULTIPLE ELECTROCHEMISTRIES AND ENERGY GATHERING COMPONENTS WITHIN A UNIFIED STRUCTURE

CROSS-REFERENCES TO RELATED APPLICATIONS

This application claims priority to U.S. Provisional Patent Application No. 61/112,707, filed on Nov. 7, 2008, entitled "A method for manufacture and structure of multiple electrochemistries and energy gathering components within a unified structure," the disclosure of which is hereby incorporated by reference in its entirety for all purposes.

SUMMARY OF THE INVENTION

According to the present invention, techniques related to energy devices are provided. More particularly, embodiments of the present invention relate to methods to design, manufacture, and structure a multi-component energy device having a unified structure. The individual components can include electrochemical cells, photovoltaic cells, fuel-cells, capacitors, ultracapacitors, thermoelectric, piezoelectric, microelectromechanical turbines, or energy scavengers. The methods and systems described herein are also applicable to a variety of energy systems.

According to an embodiment of the present invention, a method for manufacturing an integrated battery and device structure is provided. The method includes providing two or more electrochemical cells integrated with each other. The two or more electrochemical cells include related two or more electrochemistries. The method also includes forming one or more devices integrally with the two or more electrochemical cells to form the integrated battery and device structure.

Numerous benefits are achieved by way of the present invention over conventional techniques. For example, electrochemical cells described herein present multiple chemistries to accommodate a wider range of voltage and current compared to individual ones. Additionally, energy-scavenging elements are utilized to collect energy and replenish it to other components within the unified structure. Depending upon the embodiment, one or more of these benefits may be achieved. These and other benefits will be described in more detail throughout the present specification and more particularly below.

These and other objects and features of the present invention and the manner of obtaining them will become apparent to those skilled in the art, and the invention itself will be best understood by reference to the following detailed description read in conjunction with the accompanying drawings.

DETAILED DESCRIPTION OF SPECIFIC EMBODIMENTS

Example 1

Figure 1:
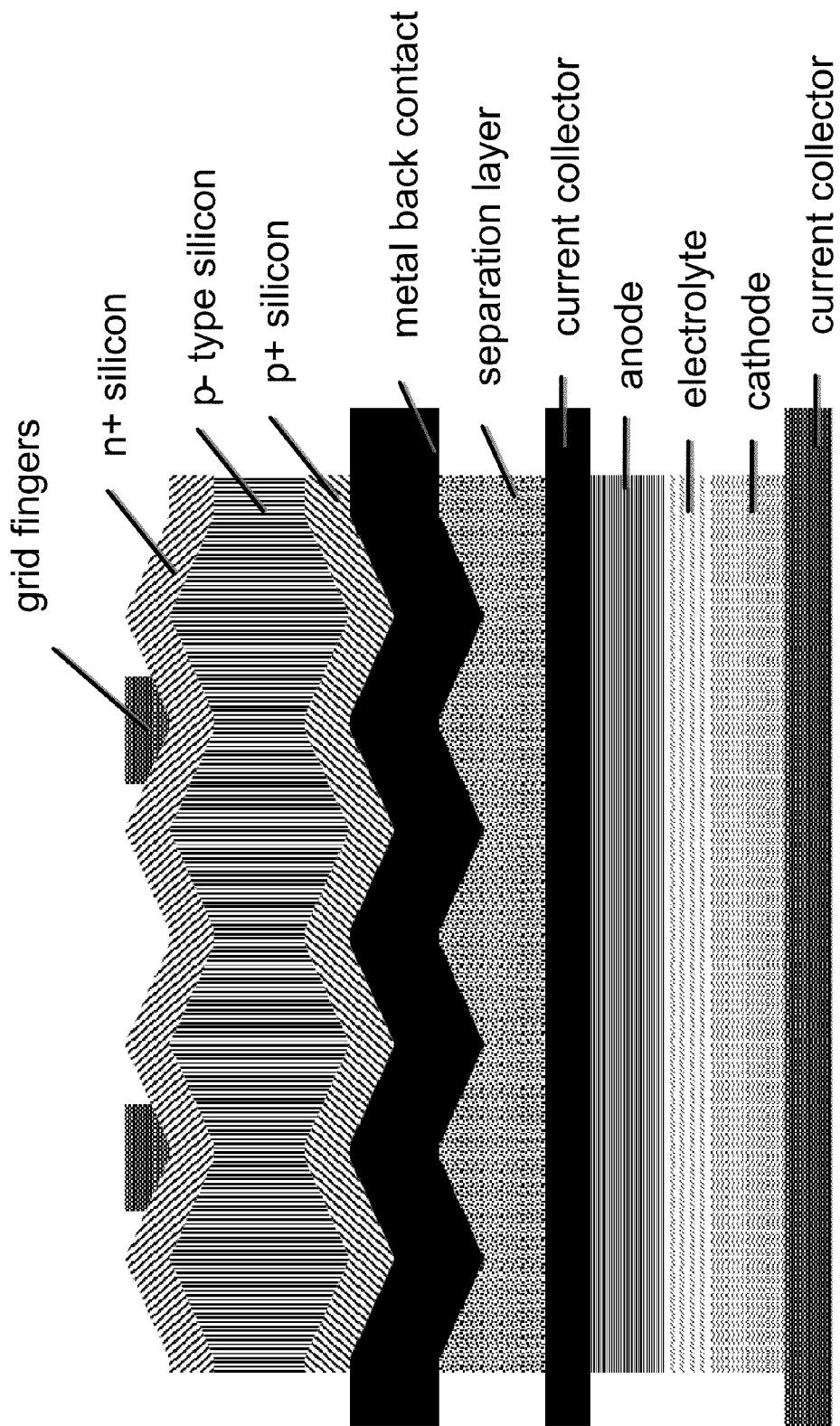
FIG. 1—Simplified cross-sectional view of a unified structure including an integrated silicon (Si) solar cell and a thin film battery.

A Unified Structure Including a Silicon (Si) Solar Cell and a Thin Film Battery and their Manufacturing Method Preparing a stacked cell on the back surface of a silicon (Si) solar cell as shown in FIG. 1 can be achieved by forming the cell components using physical vapor deposition. A solar cell exploiting p-type silicon is constructed using traditional Si wafers (Czochralski method). After forming a p-n junction by diffusing phosphorous (P) into the wafer, an aluminum (Al) back contact is created (metal back contact in FIG. 1), onto the p+ doped region (lower side) of the silicon wafer, using physical vapor deposition. The aluminum layer is grown to a thickness of 1-2 µm.

After the back metal contact is created, a separation layer of electrically insulating and thermally conductive aluminum nitride (AlN), having a thickness of 3-5 µm, is fabricated onto the aluminum layer using PVD. This layer has the function of removing heat from the two elements and convey it to a heat sink.

After the cooling element is completed, the battery components are deposited sequentially and conformally by a physical vapor deposition (PVD) process: an aluminum (Al) current collector layer (1-3 µm thick), a lithium manganese oxide ($LiMn_2O_4$) cathode layer (3-5 µm thick), a lithium phosphorous oxynitride (LIPON) ceramic electrolyte layer (1-3 µm thick), a lithium (Li) metal anode layer (3-5 µm thick) and a copper (Cu) current collector layer (1-3 µm thick), respectively."

Example 2

Figure 2:
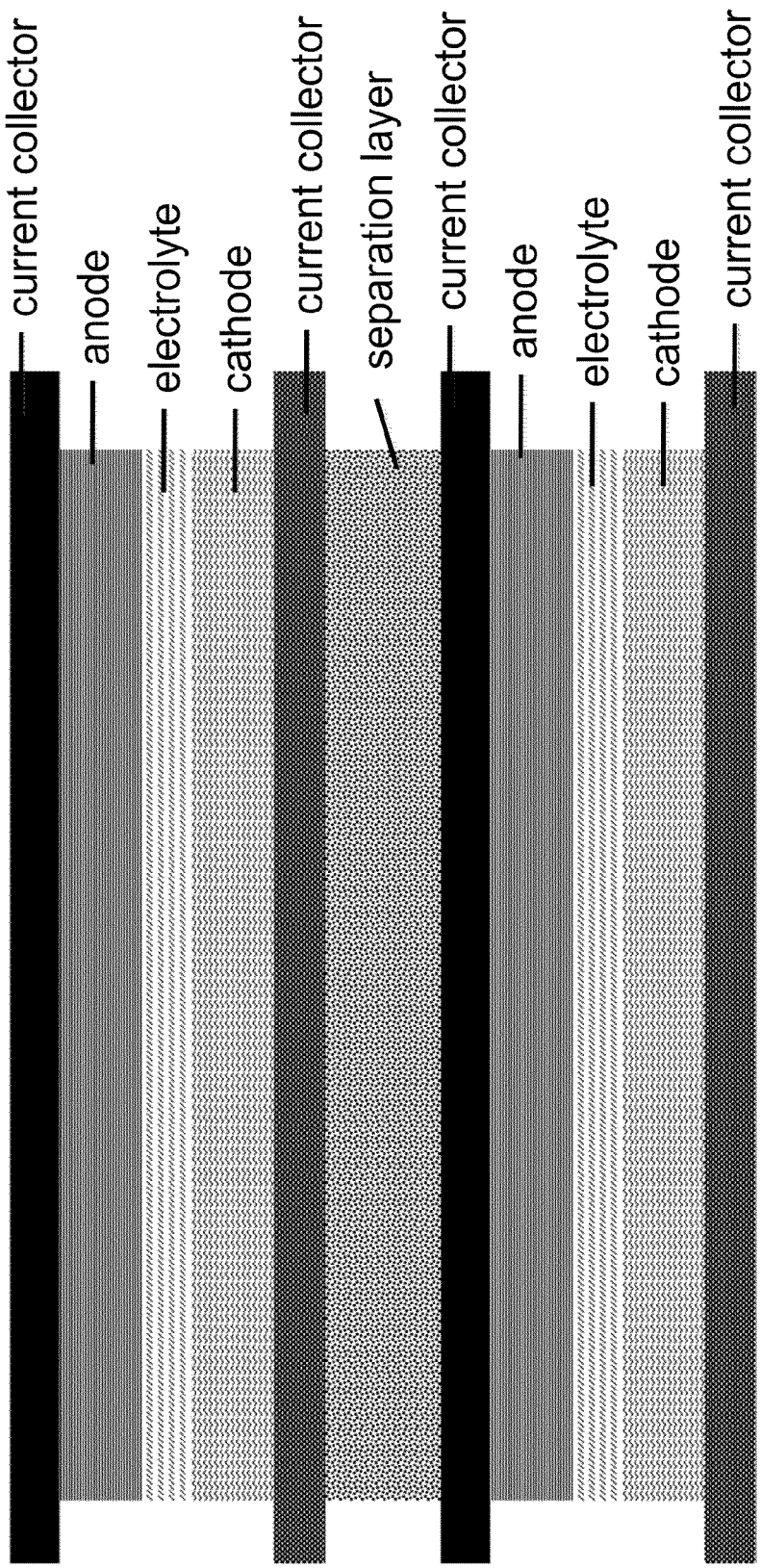
FIG. 2—Simplified cross-sectional view of a unified structure including two integrated thin film batteries having different chemistry.

A Unified Structure Including Two Thin Film Batteries Having Different Chemistry and their Manufacturing Method Two stacked cells having different electrochemistries are fabricated onto each other by using physical vapor deposition as reported in FIG. 2.

The first battery components are deposited using a PVD process onto an aluminum (Al) metal film used as cathode current collector: a lithium iron phosphate ($LiFePO_4$) cathode layer (3-5 µm thick), a lithium phosphorous oxynitride (LIPON) ceramic electrolyte layer (1-3 µm thick), a lithium (Li) metal anode layer (3-5 µm thick) and a copper (Cu) current collector layer (1-3 µm thick), respectively.

After the copper (Cu) metal current collector is created, a separation layer of electrically insulating and thermally conductive aluminum nitride (AlN), having a thickness of 3-5 µm, is fabricated onto the copper layer using PVD. This layer has the function of removing heat from the two elements and convey it to a heat sink.

After the cooling element is completed, the second battery components are deposited sequentially and conformally by a PVD process: an aluminum (Al) current collector layer (1-3 µm thick), a lithium manganese oxide ($LiMn_2O_4$) cathode layer (3-5 µm thick), a lithium phosphorous oxynitride (LIPON) ceramic electrolyte layer (1-3 µm thick), a lithium (Li) metal anode layer (3-5 µm thick) and a copper (Cu) current collector layer (1-3 µm thick), respectively.

Example 3

Figure 3:
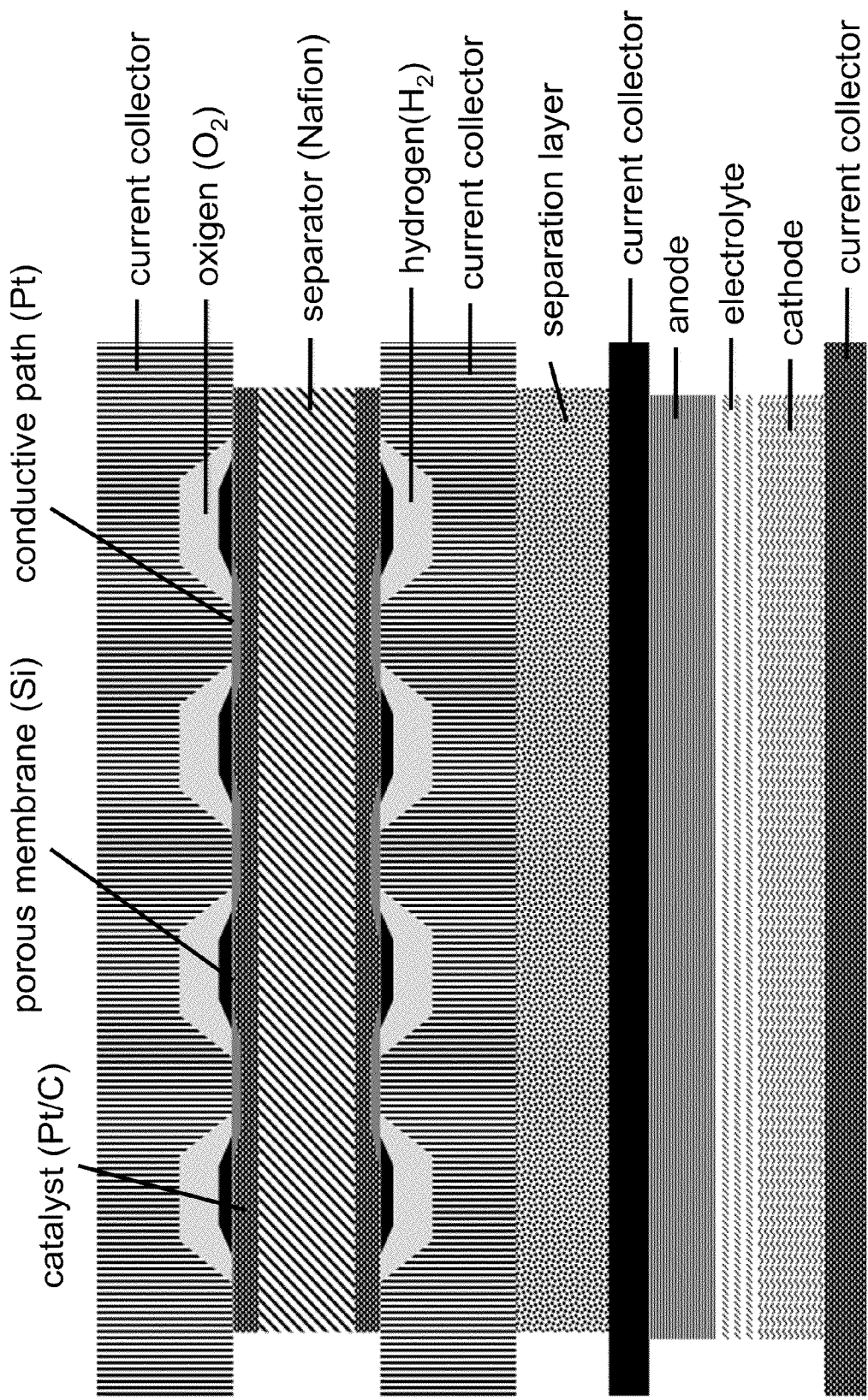
FIG. 3—Simplified cross-sectional view of a unified structure including an integrated hydrogen/oxygen fuel-cell and a thin film battery.

A Unified Structure Including a Fuel-Cell and a Thin Film Battery and their Manufacturing Method Preparing a stacked cell on the back surface of a proton-exchange membrane (PEM) fuel-cell as shown in FIG. 3 can be achieved by forming the cell components using physical vapor deposition (PVD). A PEM fuel-cell exploiting proton exchange membranes with high proton conductivity, employing perfluorosulfonate ionomers electrolytes such as Nafion®, is constructed using traditional sol-gel methods for fabricating the membrane and wet slurry for the electrodes.

After assembly of the fuel-cell a separation layer of electrically insulating and thermally conductive aluminum nitride (AlN), having a thickness of 3-5 µm, is fabricated onto the fuel-cell current collector using PVD. This layer has the function of removing heat from the two elements and conveying it to a heat sink.

After the cooling element is completed, the battery components are deposited sequentially and conformally by a PVD process. Respectively an aluminum (Al) current collector layer (1-3 µm thick), a lithium manganese oxide ($LiMn_2O_4$) cathode layer (3-5 µm thick), a lithium phosphorous oxynitride (LIPON) ceramic electrolyte layer (1-3 µm thick), a lithium (Li) metal anode layer (3-5 µm thick) and a copper (Cu) current collector layer (1-3 µm thick).

Example 4

A Unified Structure Including an Ultra-Capacitor and a Thin Film Battery and their Manufacturing Method Preparing a stacked cell on the back surface of an electrochemical double layer capacitor (EDLC), which is also known as an ultra-capacitor) as shown in FIG. 3 can be achieved by forming the cell components using PVD. In such a hybrid system, the battery provides high energy density while the EDLC enables high power capability in the system.

Figure 4:
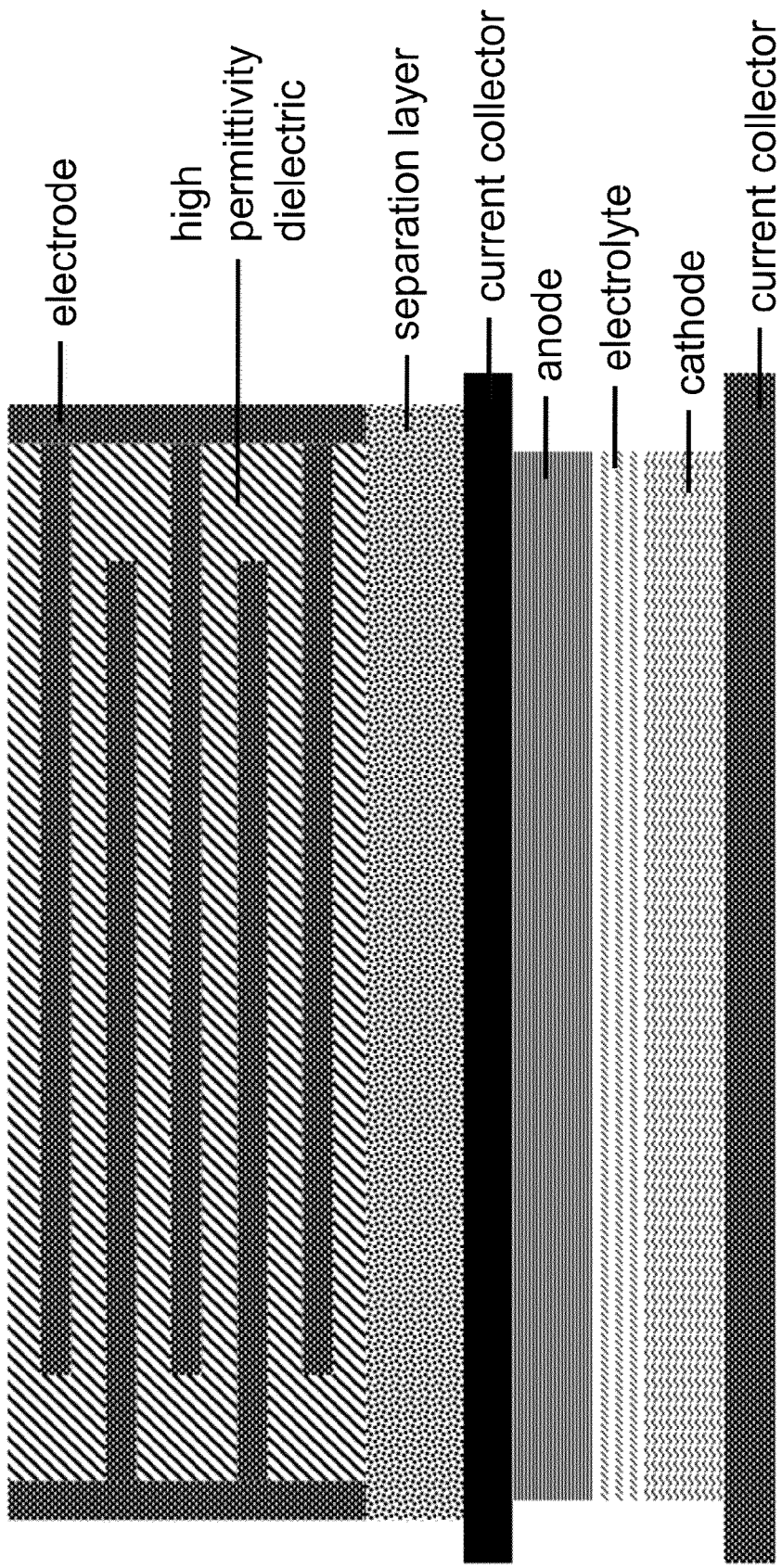
FIG. 4—Simplified cross sectional view of a unified structure including an integrated ultra-capacitor and a thin film battery.

EDLCs describe a class of energy-storage devices that incorporate active materials including high-surface-area carbons (activated carbons), electroactive polymers, transition metal oxides and nitrides. The separation materials include advanced dielectrics, conventional and advanced polymer electrolytes and ionic conducting materials. Electrodes arrangement can be symmetric or anti-symmetric. In FIG. 4 an anti-symmetric electrode arrangement is presented for the device electrodes. The electrodes of the capacitor can be formed by high-surface-area materials such as activated carbon of high capacitance redox-active materials such as metal oxides (e.g. hydrous ruthenium oxides, $RuO_2.0.5H_2O$) prepared by sol-gel methods with capacitance up to 700 F/g. Using anti-symmetric electrodes and different anode and cathode materials resulting in higher working voltages enhances the energy-storage capability of this element.

After assembly of the ultra-capacitor a separation layer of electrically insulating and thermally conductive aluminum nitride (AlN), having a thickness of 3-5 µm, is fabricated onto the dielectric material layer using PVD. This layer has the function of removing heat from the two elements and conveying it to a heat sink.

After the cooling element is completed, the battery components are deposited sequentially and conformally by a PVD process: an aluminum (Al) current collector layer (1-3 µm thick), a lithium manganese oxide ($LiMn_2O_4$) cathode layer (3-5 µm thick), a lithium phosphorous oxynitride (LIPON) ceramic electrolyte layer (1-3 µm thick), a lithium (Li) metal anode layer (3-5 µm thick) and a copper (Cu) current collector layer (1-3 µm thick), respectively.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing an integrated battery and device structure, the method comprising:
   providing two or more stacked electrochemical cells integrated with each other formed overlying a surface of a substrate, the two or more stacked electrochemical cells comprising related two or more different electrochemistries; and
   performing one or more sequential deposition processes in forming one or more devices integrally with the two or more stacked electrochemical cells to form the integrated battery and device structure as a unified structure overlying the surface of the substrate;
   whereupon the one or more stacked electrochemical cells and the one or more devices are integrated as the unified structure using the one or more sequential deposition processes; and
   wherein the integrated battery and device structure is configured such that the two or more stacked electrochemical cells and one or more devices are in electrical, chemical, and thermal conduction with each other.

2. The method of claim 1 wherein the one or more sequential deposition processes is one of at least evaporation, physical vapor deposition (PVD), chemical vapor deposition (CVD), low pressure chemical vapor deposition (LPCVD), electrochemical vapor deposition (EVD), electroplating, atomic layer deposition (ALD), direct laser writing (DLW), sputtering, radio frequency magnetron sputtering, microwave plasma enhanced chemical vapor deposition (MPECVD), pulsed laser deposition (PLD), nanoimprint, ion implantation, laser ablation, spray deposition, spray pyrolysis, spray coating, plasma spraying, sol/gel dipping spinning or sintering.

3. A method for manufacturing an integrated battery and device structure, the method comprising:
   forming, using physical vapor deposition processes using one or more sequential deposition processes, two or more electrochemical cells integrated with each other overlying a surface of a substrate, the two or more electrochemical cells comprising related two or more different electrochemistries, the two or more electrochemical cells being two or more different electrochemistries in a stacked configuration; and
   forming one or more devices integrally with the two or more electrochemical cells to form the integrated battery and device structure overlying the surface of the substrate, wherein the integrated battery and device structure is configured such that the two or more electrochemical cells and one or more devices are in electrical, chemical, and thermal conduction with each other;
   wherein the one or more electrochemical cells and the one or more devices are integrated as a unified structure using the one or more sequential deposition processes that forms the unified structure;
   wherein the two or more electrochemical cells are configured as the stack in series and/or in parallel.

4. The method of claim 3 further comprising a separation region configured for heat transfer provided between the two or more electrochemical cells.

5. The method of claim 4 wherein the separation region configured for thermal transfer is formed from at least diamond (C), poly-diamond (poly-C), alumina, boron nitride, aluminum nitride, or silicon carbide.

6. The method of claim 1 wherein the two or more electrochemistries selected from at least lithium (Li), lithium-ion, lithium-metal-polymer (LiM-polymer), lithium (Li)-air, lead (Pb)-acid, nickel metal hydrate (Ni/MH), nickel-zinc (Ni/Zn), zinc (Zn)-air, molten salts (Na/NiCl$_2$), zebra (NaAlCl$_4$), nickel-cadmium (Ni/Cd), silver-zinc (Ag/Zn).

7. The method of claim 1 wherein the device comprise a microelectromechanical system (MEMS) sensing element.

8. The method of claim 1 wherein the device comprises one or more fuel-cells.

9. The method of claim 1 wherein the device comprises one or more photovoltaics.

10. The method of claim 1 wherein the device comprises one or more capacitors.

11. The method of claim 1 wherein the device comprise one or more ultracapacitors.

12. The method of claim 1 wherein the device comprises a hybrid combination of units selected from the group consisting of electrochemical cells, fuel-cells, photovoltaic cells, capacitors, ultracapacitors, piezoelectric, thermo-electric, microelectromechanical turbines and energy scavengers.

13. The method of claim 1 further comprising a monitoring device consisting of a data BUS in logic contact and communication with the one or more devices and a central computing and processing unit (CPU), the CPU having control over one or more individual elements.

14. The method of claim 13 wherein the monitoring device is configured to detect temperature T.

15. The method of claim 13 wherein the monitoring device is configured to detect stress within one or more components.

16. The method of claim 13 wherein the monitoring device is configured to detect gas and gaseous reaction by products from operation at least either the one or more electrochemical cells or one or more devices.

17. The method of claim 13 wherein the monitoring device is configured to detect lithium composition and a transition through an anode and a cathode separation layer.

18. The method of claim 1 further comprising one or more monitoring devices to maintain a safe operation of the two or more electrochemical cells or the one or more devices.

19. The method of claim 1 further comprising a cooling system consisting of liquid coolant or liquefied gases activated if temperature rises above a set threshold, the cooling system being in thermal contact with heat sinks designed to remove thermal energy using one or more conducting paths.

20. The method of claim 1 wherein the two or more electrochemical cells is configured using hybrid principles applied to optimize device architecture, schedule, energy and power density along with rechargeability and lifetime.

* * * * *